(12) United States Patent
Guan et al.

(10) Patent No.: US 8,238,105 B2
(45) Date of Patent: Aug. 7, 2012

(54) HEAT SINK AND ELECTRONIC DEVICE USING THE SAME

(75) Inventors: Zhi-Bin Guan, Taipei Hsien (TW);
Yao-Ting Chang, Taipei Hsien (TW);
Zeu-Chia Tan, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 125 days.

(21) Appl. No.: 12/849,936

(22) Filed: Aug. 4, 2010

(65) Prior Publication Data

US 2011/0310567 A1 Dec. 22, 2011

(30) Foreign Application Priority Data

Jun. 18, 2010 (TW) ................................ 99119865 A

(51) Int. Cl.
*H05K 7/20* (2006.01)
(52) U.S. Cl. ....... 361/719; 361/704; 361/707; 165/80.3; 174/16.1
(58) Field of Classification Search ........................ None
See application file for complete search history.

(56) References Cited

U.S. PATENT DOCUMENTS

| 5,684,675 | A  | * | 11/1997 | Taniguchi et al. | 361/704 |
| 5,815,371 | A  | * | 9/1998  | Jeffries et al.  | 361/704 |
| 6,201,695 | B1 | * | 3/2001  | Duesman et al.   | 361/703 |
| 7,079,396 | B2 | * | 7/2006  | Gates et al.     | 361/719 |
| 7,106,595 | B2 | * | 9/2006  | Foster et al.    | 361/721 |
| 7,675,164 | B2 | * | 3/2010  | Bartley et al.   | 257/718 |
| 7,710,727 | B2 | * | 5/2010  | Liu et al.       | 361/710 |
| 7,755,897 | B2 | * | 7/2010  | Chen et al.      | 361/707 |
| 8,059,406 | B1 | * | 11/2011 | Meyer et al.     | 361/701 |
| 2006/0221573 | A1 | * | 10/2006 | Li            | 361/704 |
| 2007/0070607 | A1 | * | 3/2007  | Goodwin       | 361/719 |
| 2011/0310563 | A1 | * | 12/2011 | Meyer et al.  | 361/704 |

* cited by examiner

*Primary Examiner* — Boris Chervinsky
(74) *Attorney, Agent, or Firm* — Altis Law Group, Inc.

(57) ABSTRACT

An electronic device includes a chassis, a circuit board installed in the chassis, a memory card coupled to the circuit board, and a heat sink for cooling the memory card. The heat sink includes a first cooling plate, a second cooling plate, and a connection member connected between corresponding sides of the first cooling plate and the second cooling plate. A conducting member extends from the connection member, and contacts the chassis.

3 Claims, 2 Drawing Sheets

HEAT SINK AND ELECTRONIC DEVICE USING THE SAME

BACKGROUND

1. Technical Field

The present disclosure relates to a heat sink.

2. Description of Related Art

It is well known that many electronic systems comprising many electronic elements generate a large amount of heat, and the heat must be promptly removed to ensure proper operation of the system. Generally, heat sinks are mounted on electronic elements to remove the heat. However, due to limited available space, heat sinks are small, and correspondingly have limited heat dissipation capability. Thus, the heat generated by a component such as a memory card may not be removed rapidly enough.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
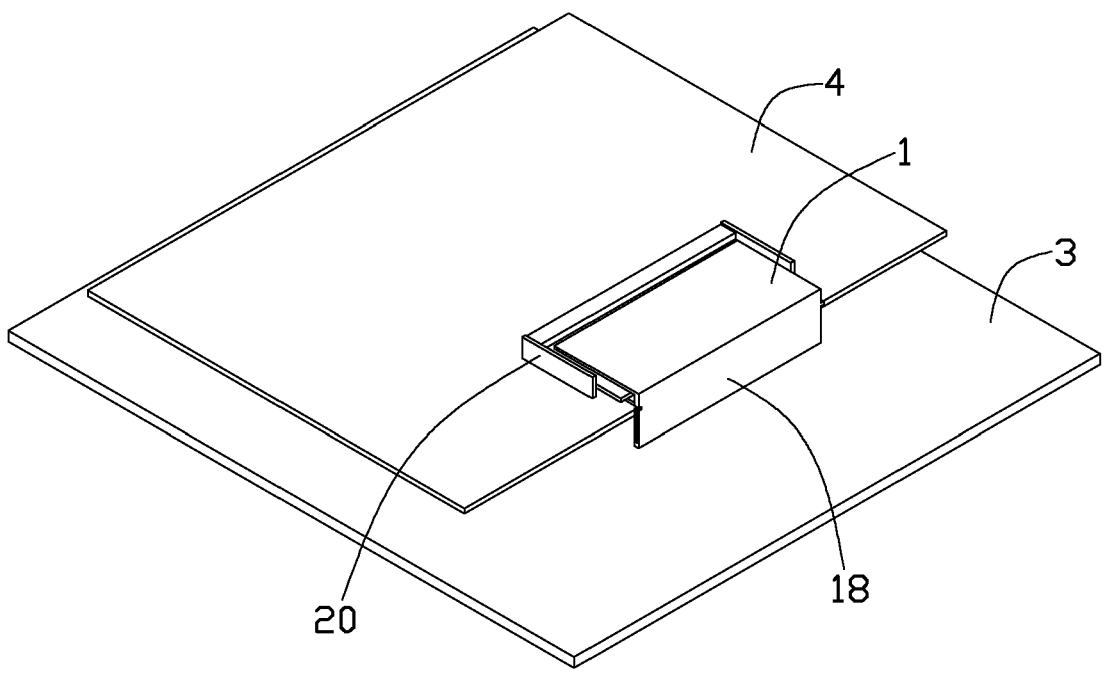
FIG. 1 is an assembled, isometric view of an exemplary embodiment of an electronic device including a heat sink, a slot and a memory card.
Figure 2:
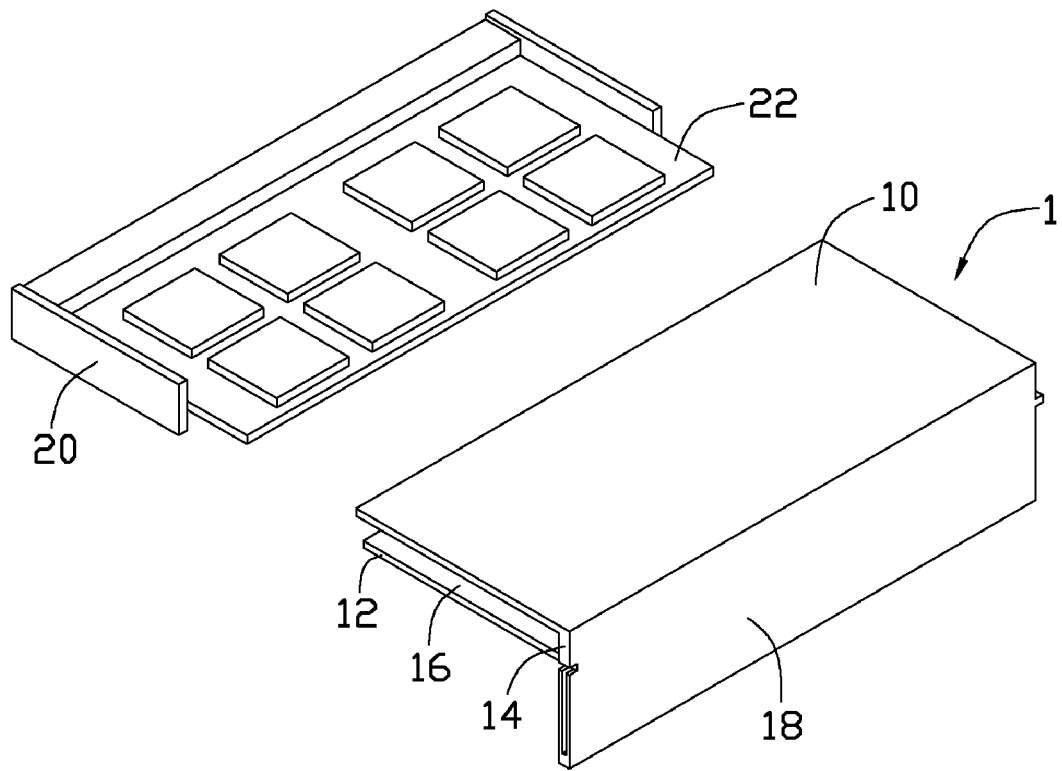
FIG. 2 is an exploded, isometric view of the heat sink, the slot and the memory card of FIG. 1.

Referring to FIG. 1 and FIG. 2, an exemplary embodiment of a heat sink 1 used for cooling an electronic element 22 of an electronic device is shown. In an embodiment, the electronic element 22 is a memory card.

The electronic device includes a chassis 3, and a circuit board 4 installed on the chassis 3. The circuit board 4 includes an expansion slot 20, adjacent to a side of the circuit board 4. The electronic element 22 is parallel to the circuit board 4 and is inserted into the slot 20.

The heat sink 1 includes a horizontal first cooling plate 10, a second cooling plate 12 opposite and parallel to the first cooling plate 10, and a connection member 14 perpendicularly connected between corresponding sides of the first cooling plate 10 and the second cooling plate 12. A receiving space 16 for receiving the electronic element 22 is bounded by the first cooling plate 10, the second cooling plate 12, and the connection member 14. A conducting member 18 extends down from the connection member 14.

In assembly, the heat sink 1 is attached to the electronic element 22 to receive the electronic element 22 in the receiving space 16, with the first and second cooling plate 10 and 12 sandwiching the electronic element 22. A bottom side of the conducting member 18 contacts the chassis 3.

In use, heat can be evacuated by the first and second cooling plates 10 and 12 and the conducting member 18. Furthermore, heat can be exchanged to the chassis 3 by the conducting member 18, such that heat dissipation area of the heat sink 1 is increased, and heat dissipation efficiency is improved.

It is believed that the present embodiments and their advantages will be understood from the foregoing description, and they will be apparent that various changes may be made thereto without departing from the spirit and scope of the description or sacrificing all of their material advantages, the examples hereinbefore described merely being exemplary embodiment.

What is claimed is:

1. An electronic device, comprising:
   a chassis;
   a circuit board installed on the chassis, wherein the circuit board comprises an electronic element mounted on the circuit board; and
   a heat sink, wherein the heat sink comprises:
      a first cooling plate;
      a second cooling plate opposite and parallel to the first cooling plate, wherein the first and second cooling plates sandwiching the electronic element;
      a connection member connected between corresponding sides of the first cooling plate and the second cooling plate; and
      a conducting member extending from the connection member and contacting the chassis.

2. The electronic device of claim 1, wherein the electronic element is a memory card.

3. The electronic device of claim 1, wherein a receiving space is bounded by the first cooling plate, the second plate, and the connection member, to receive the electronic element.

* * * * *